(12) United States Patent
Broekaart et al.

(10) Patent No.: US 8,679,944 B2
(45) Date of Patent: Mar. 25, 2014

(54) PROGRESSIVE TRIMMING METHOD

(75) Inventors: Marcel Broekaart, Theys (FR); Marion Migette, Grenoble (FR); Sébastien Molinari, Sassenage (FR); Eric Neyret, Sassenage (FR)

(73) Assignee: Soitec, Bernin (FR)

( * ) Notice: Subject to any disclaimer, the term of this patent is extended or adjusted under 35 U.S.C. 154(b) by 184 days.

(21) Appl. No.: 12/934,026

(22) PCT Filed: Jul. 31, 2009

(86) PCT No.: PCT/EP2009/059961
§ 371 (c)(1),
(2), (4) Date: Dec. 8, 2010

(87) PCT Pub. No.: WO2010/026007
PCT Pub. Date: Mar. 11, 2010

(65) Prior Publication Data
US 2011/0097874 A1     Apr. 28, 2011

(30) Foreign Application Priority Data

Sep. 2, 2008  (FR) ...................................... 08 55875

(51) Int. Cl.
*H01L 21/46* (2006.01)
*H01L 21/30* (2006.01)

(52) U.S. Cl.
USPC ........... 438/459; 438/455; 438/406; 438/977; 438/690; 257/E21.237

(58) Field of Classification Search
USPC ................................................ 438/455, 459
See application file for complete search history.

(56) References Cited

U.S. PATENT DOCUMENTS

| 5,223,001 | A |   | 6/1993  | Saeki ........................ 29/25.01 |
| 5,537,884 | A |   | 7/1996  | Nishimura et al. ............. 73/842 |
| 5,696,327 | A |   | 12/1997 | Huang et al. ................... 73/845 |
| 5,834,812 | A | * | 11/1998 | Golland et al. ............... 257/347 |
| 5,937,312 | A | * | 8/1999  | Iyer et al. ..................... 438/459 |

(Continued)

FOREIGN PATENT DOCUMENTS

| EP | 0 366 208 A2 | 5/1990 |
| EP | 0 444 942 B1 | 9/1991 |

(Continued)

OTHER PUBLICATIONS

European Search Report, French Appln. No. 1002618, dated Jan. 25, 2011.

(Continued)

*Primary Examiner* — Steven Loke
*Assistant Examiner* — David Goodwin
(74) *Attorney, Agent, or Firm* — Winston & Strawn LLP

(57) ABSTRACT

The invention provides a method of trimming a structure that includes a first wafer bonded to a second wafer, with the first wafer having a chamfered edge. The method includes a first trimming step carried out over a first depth that includes at least the thickness of the first wafer and over a first width determined from the edge of the first wafer. A second trimming step is then carried out over a second depth that includes at least the thickness of the first wafer and over a second width that is less than the first width.

17 Claims, 6 Drawing Sheets

(56) References Cited

U.S. PATENT DOCUMENTS

| | | | |
|---|---|---|---|
| 6,008,113 A | 12/1999 | Ismail et al. | 438/615 |
| 6,110,391 A * | 8/2000 | Takei et al. | 216/2 |
| 6,113,721 A * | 9/2000 | Secco d'Aragona et al. | 156/154 |
| 6,117,695 A | 9/2000 | Murphy et al. | 438/15 |
| 6,180,496 B1 | 1/2001 | Farrens et al. | 438/455 |
| 6,207,005 B1 | 3/2001 | Henley et al. | 156/345 |
| 6,221,774 B1 * | 4/2001 | Malik | 438/690 |
| 6,387,815 B2 | 5/2002 | Sakamoto | 438/709 |
| 6,417,108 B1 * | 7/2002 | Akino et al. | 438/690 |
| 6,523,419 B1 | 2/2003 | Nonaka et al. | 73/827 |
| 6,583,029 B2 * | 6/2003 | Abe et al. | 438/455 |
| 6,616,332 B1 | 9/2003 | Renken et al. | 374/162 |
| 6,645,828 B1 | 11/2003 | Farrens et al. | 438/455 |
| 6,908,832 B2 | 6/2005 | Farrens et al. | 438/455 |
| 7,250,368 B2 * | 7/2007 | Kida et al. | 438/690 |
| 7,727,860 B2 * | 6/2010 | Miyazaki et al. | 438/459 |
| 2001/0055863 A1 * | 12/2001 | Nakano et al. | 438/549 |
| 2002/0187595 A1 | 12/2002 | Walitzki et al. | 438/184 |
| 2003/0079828 A1 | 5/2003 | Kassir et al. | 156/230 |
| 2003/0168145 A1 | 9/2003 | Suga et al. | 156/60 |
| 2004/0085858 A1 | 5/2004 | Khuri-Yakub et al. | 367/181 |
| 2004/0121556 A1 * | 6/2004 | Kim et al. | 438/455 |
| 2004/0229444 A1 | 11/2004 | Couillard et al. | 438/455 |
| 2004/0246795 A1 | 12/2004 | Tomita | 365/200 |
| 2005/0081958 A1 | 4/2005 | Adachi et al. | 148/33.1 |
| 2005/0152089 A1 | 7/2005 | Matsuda et al. | 361/234 |
| 2006/0055003 A1 | 3/2006 | Tomita et al. | 257/629 |
| 2007/0039395 A1 | 2/2007 | Gupta et al. | 73/800 |
| 2007/0072393 A1 | 3/2007 | Aspar et al. | 438/459 |
| 2007/0117229 A1 | 5/2007 | Schwarzenbach et al. | 438/14 |
| 2007/0158831 A1 | 7/2007 | Cha et al. | 257/724 |
| 2007/0237448 A1 | 10/2007 | Sato et al. | 385/13 |
| 2008/0044984 A1 | 2/2008 | Hsieh et al. | 438/459 |
| 2008/0053619 A1 | 3/2008 | Nakayama et al. | 156/382 |
| 2008/0128621 A1 | 6/2008 | Berry | 250/338.1 |
| 2008/0128898 A1 | 6/2008 | Henderson et al. | 257/713 |
| 2008/0200008 A1 | 8/2008 | Kerdiles et al. | 438/455 |
| 2009/0023271 A1 | 1/2009 | Couillard et al. | 438/458 |
| 2009/0042363 A1 | 2/2009 | Miyazaki et al. | 438/459 |
| 2009/0111245 A1 * | 4/2009 | Okabe et al. | 438/459 |
| 2010/0122762 A1 | 5/2010 | George | 156/64 |
| 2010/0155882 A1 | 6/2010 | Castex | 257/507 |
| 2011/0045611 A1 | 2/2011 | Castex et al. | 438/5 |
| 2011/0308721 A1 | 12/2011 | Broekaart et al. | 156/285 |
| 2012/0038027 A1 | 2/2012 | Broekaart | 257/618 |
| 2012/0048007 A1 | 3/2012 | Landru | 73/150 A |

FOREIGN PATENT DOCUMENTS

| | | |
|---|---|---|
| EP | 0 451 993 A2 | 10/1991 |
| EP | 0 854 500 B1 | 7/1998 |
| EP | 0 860 862 B1 | 8/1998 |
| EP | 0 935 280 B1 | 8/1999 |
| EP | 0 964 436 A2 | 12/1999 |
| EP | 1 189 266 A1 | 3/2002 |
| EP | 1 662 549 A1 | 5/2006 |
| EP | 1 887 613 A1 | 2/2008 |
| EP | 1 998 368 A2 | 12/2008 |
| EP | 2 200 077 A1 | 6/2010 |
| FR | 2 935 535 A1 | 3/2010 |
| JP | 3089519 B2 | 4/1991 |
| JP | 4263425 A | 9/1992 |
| JP | 045485 A | 2/1995 |
| JP | 7045485 A | 2/1995 |
| JP | 9-17984 A | 1/1997 |
| JP | 9017984 A | 1/1997 |
| JP | 11017701 A | 1/1999 |
| JP | 11067701 A | 3/1999 |
| JP | 11354761 A | 12/1999 |
| JP | 2001-144274 A | 5/2001 |
| JP | 2001144274 A | 5/2001 |
| WO | WO 99/60607 A2 | 11/1999 |
| WO | WO 03/008938 A2 | 1/2003 |
| WO | WO 03/019157 A1 | 3/2003 |

OTHER PUBLICATIONS

European Search Report for EP08291226 dated Jul. 7, 2009.

Andreas Plöβl et al., "Covalent Silicon Bonding at Room Temperature in Ultra High Vacuum", Mat. Res. Soc. Symp. Proc., vol. 483, pp. 141-146, Materials Research Society (1998).

Hideki Takagi et al, "Wafer-Scale Spontaneous Bonding of Silicon Wafers by Argon-Beam Surface Activation at Room Temperature", Sensors and Actuators A, vol. 105, pp. 98-102 (2003).

R. H. Esser et al., "Improved Low-Temperature Si-Si Hydrophilic Wafer Bonding", Journal of The Electrochemical Society, vol. 150, pp. G228-G231 (2003).

Burns, James A. et al., "A Wafer-Scale 3-D Circuit Integration Technology", IEEE Transactions on Electron Devices, vol. 53, No. 10, pp. 2507-2516 (2006).

Steen, Steven E. et al., "Overlay as the Key to Drive Wafer Scale 3D Integration", Microelectronic Engineering, vol. 84, pp. 1412-1415 (2007).

Topol, Anna W. et al., "3D Fabrication Options for High-Performance CMOS Technology", Wafer Level 3 ICs Process Technology, Tan, Gutmann, Reif Eds., pp. 197-217 (2008).

Gosele, U. et al., "Self-Propagating Room-Temperature Silicon Wafer Bonding in Ultrahigh Vacuum", Applied Phys. Lett., vol. 67, No. 24, pp. 3614-3615 (1995).

W.P. Maszara, et al., "Bonding of Silicon Wafers for Silicon-on-Insulator", J. Appl. Phys., vol. 64, No. 10, pp. 4943-4950, (1988).

International Search Report, PCT/EP2009/059961, mailed Oct. 5, 2009.

Preliminary Search Report and Written Opinion with English Translation for Application FR 1056719 dated Apr. 12, 2011.

Takagi et al., "Room Temperature Silicon Wafer Direct Bonding in Vacuum by Ar Beam Irradiation," Micro Electro Mechanical Systems, 1997, MEMS '97, Proceedings, IEEE, Tenth Annual International Workshop on Jan. 26-30, 1997, Nagoya, Japan, pp. 191-196. Online search, URL: http://ieeexplore.ieee.org/stamp/stamp.jsp?tp=&arnumber=581801.

* cited by examiner

PROGRESSIVE TRIMMING METHOD

This application is a 371 filing of International Patent Application PCT/EP2009/059961 filed Jul. 31, 2009.

FIELD OF THE INVENTION AND PRIOR ART

The present invention relates to the field of producing multilayer semiconductor structures or substrates (also termed multilayer semiconductor wafers) produced by transfer of at least one layer onto a support. The transferred layer is formed by molecular bonding of a first wafer onto a second wafer or support, the first wafer generally being thinned following bonding. The first wafer may also include all or part of a component or a plurality of microcomponents, as happens with three-dimensional (3D) integration of components, which requires transfer of one or more layers of microcomponents onto a final support, and also as happens with circuit transfer as, for example, in the fabrication of back lit imaging devices.

The edges of the wafers used to form the transferred layers and the supports generally have chamfers or edge roundings serving to facilitate their manipulation and to avoid breakages at the edges that could occur if those edges were to project, such breakages being sources of particles that contaminate the wafer surfaces. The chamfers may be rounded and/or bevelled in shape.

However, the presence of such chamfers prevents good contact between the support and the wafer at their peripheries. As a result, a peripheral zone exists on which the transferred layer is not bonded or not properly bonded to the support substrate. This peripheral zone of the transferred layer must be eliminated since it is liable to break in an uncontrolled manner and contaminate the structure with unwanted fragments or particles.

Thus, once the wafer has been bonded to the support and after any necessary thinning thereof, the transferred layer is then trimmed in order to remove the peripheral zone over which the chamfers extend. Trimming is usually carried out essentially by mechanical machining, in particular by abrasion or grinding from the exposed surface of the transferred layer up to the support.

However, such trimming causes problems with peel-off, both at the bonding interface between the transferred layer and the support and in the transferred layer itself. More precisely, at the bonding interface, peel-off problems correspond to delamination of the transferred layer over certain zones in the vicinity of the periphery of the layer, which delamination may be qualified as macro peel-off. The bonding energy is lower near the periphery of the layer because of the presence of the chamfers. As a consequence, grinding in this region may cause partial detachment of the layer at its bonding interface with the support substrate. Said detachment is more probable when the transferred layer includes components. High temperature anneals, normally carried out after bonding to reinforce the bonding interface, are not used when components are present in the transferred layer since components cannot withstand the temperatures of such anneals.

Further, when the layer comprises components such as circuits, contacts, and in particular zones formed from metal, grinding may cause delamination at the motifs of the components present in the transferred layer, which delamination may be qualified as micro peel-off.

Such phenomena of macro and micro peel-off occur beyond a certain level of heating and/or mechanical stress in the structure during the trimming step. This level is frequently attained during complete trimming of the transferred layer.

SUMMARY OF THE INVENTION

The aim of the invention is to overcome the disadvantages mentioned above by proposing a method of trimming a structure comprising a first wafer bonded to a second wafer, the first wafer having a chamfered edge, the method comprising:
  a first trimming step carried out over a first depth comprising the thickness of the first wafer, said first trimming step also being carried out over a first predetermined width from the edge of the first wafer; and
  at least one second trimming step carried out over a second depth comprising at least the thickness of the first wafer, said second trimming step also being carried out over a second width that is less than the first width.

Thus, by carrying out a first trimming step as close as possible to the edge of the first wafer and over a predetermined width, the first wafer is attacked while remaining relatively far away from the components thereof. This limits heating and/or stresses in the structure even when trimming is intense, i.e. penetrating significantly into the second wafer.

Further, the heating and/or stresses are also limited during the second trimming step, even though said second trimming step is carried out at a distance that is further from the edge of the first wafer, i.e. close to the components. In fact, the material to be removed during the second trimming step is reduced because of the portion that has already been removed during the first trimming step.

As a result, the two trimming steps of the method of the invention mean that complete trimming of at least the first wafer can be carried out while substantially reducing the phenomena of macro and micro peel-off that normally appear during single-step trimming.

In accordance with one aspect of the invention, the second trimming step is carried out over a second depth that is less than or equal to the first depth over which the first trimming step is carried out.

In accordance with another aspect of the invention, the portion of the thickness of the second step removed during the first trimming step is in the range 10 µm [micrometer] to 30 µm.

In accordance with another aspect of the invention, the portion of the thickness of the second wafer removed during the second trimming step is in the range 0 to 10 µm.

In accordance with yet another aspect of the invention, the first trimming step is carried out over a first width in the range 2 mm [millimeter] to 10 mm, preferably in the range 2 mm to 6 mm, while the second trimming step is carried out over a second width in the range 0.1 mm to 2 mm.

The present invention also provides a method of producing a three-dimensional composite structure comprising at least one step of producing a layer of components on one face of a first wafer, a step of bonding the face of the first wafer comprising the layer of components onto a second wafer, and a step of trimming at least the first wafer carried out in accordance with the trimming method of the invention.

The use of the trimming method of the invention means that three-dimensional structures can be produced by stacking two or more wafers, minimizing the risks of delamination both at the bonding interfaces between the wafers and at the component layers. One of the component layers may include image sensors.

DETAILED DESCRIPTION OF IMPLEMENTATIONS OF THE INVENTION

Figure 1:
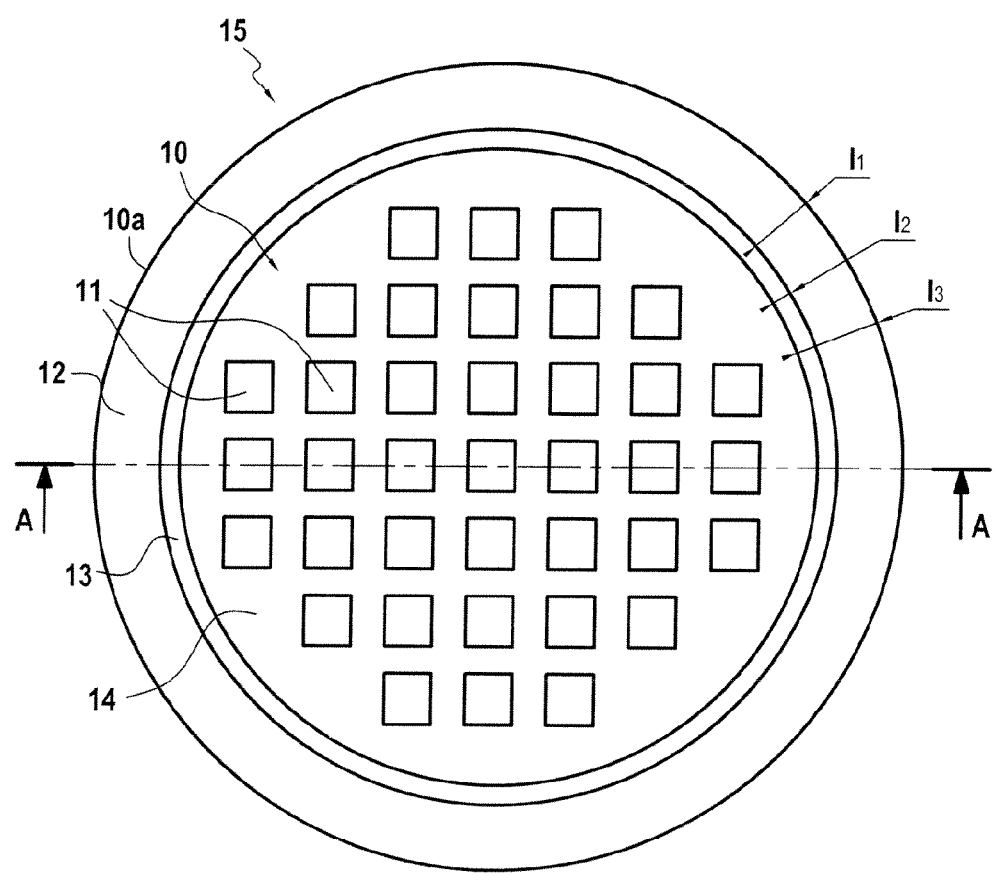
FIG. 1 is a top view of a structure to be trimmed.

The present invention is of general application to trimming a structure comprising at least two wafers assembled together by molecular bonding or any other type of bonding such as anodic bonding, metallic bonding, or bonding with adhesive, it being possible for components to be formed beforehand in the first wafer that is then bonded to the second wafer that constitutes a support. The wafers are generally of circular outline, possibly with different diameters, in particular diameters of 100 millimeters (mm), 200 mm, or 300 mm. The term "components" as used here means any type of element produced with materials that differ from the material of the wafer and that are sensitive to the high temperatures normally used to reinforce the bonding interface. These components correspond in particular to elements forming all or a portion of an electronic component or a plurality of electronic microcomponents, such as circuits or contacts or active layers that may be damaged or even destroyed if they are exposed to high temperatures. The components may also correspond to elements, motifs, or layers that are produced with materials with expansion coefficients different from that of the wafer and that, at high temperature, are liable to create different degrees of expansion in the wafer, which may deform and/or damage it.

In other words, when the first wafer includes such components, it cannot undergo high temperature anneals after bonding. As a consequence, the bonding energy between the wafers is limited, which renders the resulting structure rather more sensitive to the phenomenon of macro peel-off during mechanical trimming, as described above. Further, as explained above, the trimming may also cause micro peel-off, corresponding to delamination in the first wafer at the components (detachment in one or more of the stacks forming the components in the first wafer).

More generally, the invention is of particular application to assembled structures that cannot be subjected to a high temperature bonding anneal, as also applies with heterostructures formed by an assembly of wafers with different expansion coefficients (for example silicon-on-sapphire, silicon-on-glass, etc). It may also apply to more standard silicon-on-insulator (SOI) type structures, namely SOI structures in which the two wafers are composed of silicon. For this type of structure, the invention is of particular application to the formation of structures that have a layer thickness of more than 10 micrometers (μm), or that comprise a stack of layers of different natures. In fact, it has been observed that these structures are liable to be damaged during the trimming step when said trimming is carried out using the known prior art technique.

To this end, the present invention proposes carrying out progressive trimming from the edge of the first wafer. More precisely, as explained below in more detail, the trimming method of the invention is carried out in at least two steps, namely a first trimming step carried out as close as possible to the edge of the wafer and a second trimming step carried out at a distance further from the edge of the first wafer, i.e. over a portion that is closer to the components of the wafer.

FIG. 1 is a top view showing a structure 15 comprising a wafer 10 bonded to a subjacent support (not shown). The wafer 10 includes components 11 formed in a zone 14 termed the "useful zone" that covers the major portion of the surface of the wafer with the exception of an annular exclusion portion with a width $l_3$ corresponding to the distance between the edge 10a of the wafer 10 and the frontier of the useful zone 14. The annular exclusion portion comprises at least the zone over which the chamfers of the wafer extend. This annular portion may be divided into first and second annular zones 12 and 13. The first annular zone 12 with width $l_1$ is the zone that is closest to the edge 10a of the wafer. It is on this first zone 12 that the first trimming step of the method of the invention is carried out. This first zone is relatively distanced from the useful zone 14 including the components 11, and so trimming may be carried out in the structure without running the risk of macro or micro peel-offs. The second annular zone 13 with width $l_2$ that is less than the width $l_1$ is further from the edge 10a of the wafer, i.e. closer to the useful zone 14. However, since a large quantity of material has already been withdrawn during the first trimming step, heating and stresses are limited during the second step of trimming of the second annular zone 13. Thus, any macro and/or micro peel-off phenomena that could occur during trimming are limited.

During the second trimming step, heating and stresses may be further reduced by carrying out trimming over a depth that is less than the depth over which the first trimming step is carried out.

In order to further limit heating and stresses during trimming, the method of the invention may also be carried out in more than two steps, for example three or four trimming steps. Under such circumstances, each of the successive trimming steps is carried out over a width that is less than or identical to that of the preceding trimming step. The trimming depth for each step is preferably but not exclusively smaller than that of the preceding trimming step.

One implementation of a trimming method is described below with reference to FIGS. 2A to 2E and 3.

Figure 2A:
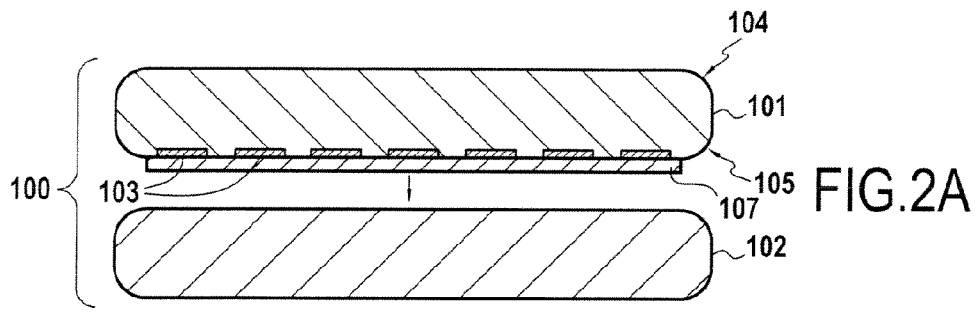
FIGS. 2A to 2E are diagrammatic views of a trimming method in accordance with one implementation of the invention.

As can be seen in FIG. 2A, a structure 100 to be trimmed is formed by assembling a first wafer 101 of the same type as that of FIG. 1 with a second wafer 102, for example formed from silicon. The first and second wafers 101 and 102 have the same diameter here. They could, however, have different diameters. In the example described here, assembly is carried out using the molecular bonding technique that is well known to the skilled person. It should be recalled that the principle of molecular bonding is based on bringing two surfaces into direct contact, i.e. without using a specific bonding material (adhesive, wax, solder etc). Such an operation requires that the surfaces to be bonded are sufficiently smooth, free from particles or contamination, and that they are brought sufficiently close together to allow contact to be initiated, typically to a distance of less than a few nanometers. Under such circumstances, forces of attraction between the two surfaces are high enough to cause molecular bonding (bonding induced by the set of attractive forces (van der Waals forces)

due to electrons interacting between atoms or molecules of the two surfaces to be bonded together).

Adhesion between the two wafers is carried out at a low temperature so as not to damage the components and/or the first wafer. More precisely, after bringing the wafers into contact at ambient temperature, a bonding reinforcement anneal may be carried out, but at a temperature of less than 450° C., beyond which temperature certain metals such as aluminum or copper begin to creep.

A bonding layer 107 of the oxide layer type is formed on the bonding face of the first wafer 101 and/or on the second wafer before bringing it into contact with the second wafer 102. The first wafer 101 comprises a layer of components 103 and has a chamfered edge, i.e. an edge comprising an upper chamfer 104 and a lower chamfer 105. In FIG. 2A, the wafers have rounded chamfers. However, the wafers may also have chamfers or edge roundings with different shapes such as in the form of a bevel. In general, the term "chamfered edge" means any wafer edge at which the ridges have been bevelled so that contact between the two wafers close to their periphery is poor.

Figure 2B:
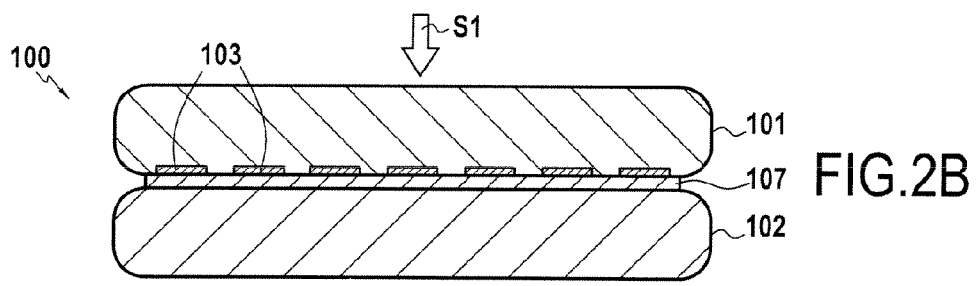
Figure 2C:
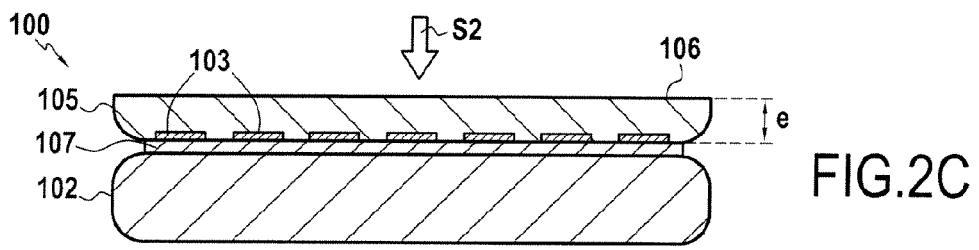

The wafers 101 and 102 are assembled one against the other by molecular bonding to form the structure 100 (step S1, FIG. 2B). Depending on the initial thickness of the first wafer 101, this may be thinned in order to form a transferred layer 106 with a predetermined thickness $e_1$ (step S2, FIG. 2C), for example approximately 10 μm. The thickness $e_1$ is measured between the upper face and the lower face of the layer of the wafer beyond the chamfered edge. This thinning step is preferably carried out before the trimming operation. Thinning of the first wafer, however, is still optional and trimming of the first wafer may be carried out without carrying out a prior thinning step.

Next, trimming of the structure 100 is carried out, principally consisting in eliminating an annular portion of the layer 106 comprising the chamfer 105, the chamfer 104 having been eliminated during thinning of the first wafer 101. In accordance with the invention, trimming commences with a first trimming step carried out over a width $ld_1$ from the edge of the first layer 106 that corresponds to the edge of the first wafer 101 (step S3, FIG. 2D). For wafers with a diameter of 100 mm, 200 mm and 300 mm, the trimming width $ld_1$ is generally in the range 2 mm to 10 mm, preferably in the range 2 mm to 6 mm. Trimming is carried out by action or mechanical machining from the upper face of the layer 106 (edge grinding). The mechanical action may be exerted using a grinder or any other tool that is capable of mechanically wearing away the material of the layer.

Figure 2D:
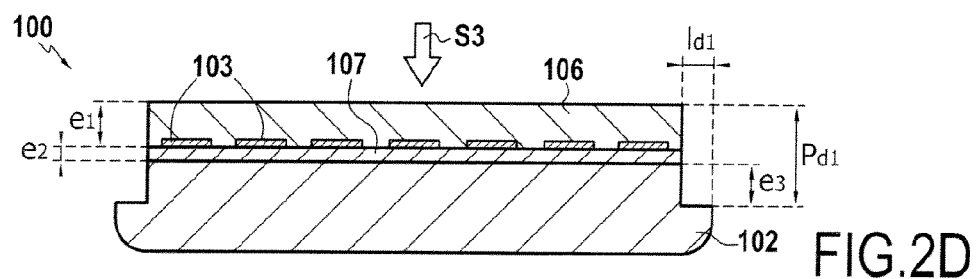

During said first trimming step, the structure 100 is attacked over a depth $Pd_1$, defined from a reference plane corresponding to the bonding interface (in this instance the plane of contact between the bonding layer 107 and the bonding face of the second wafer 102). The depth $Pd_1$ comprises the thickness $e_1$ of the layer 106, the thickness $e_2$ of the bonding layer 107 and a thickness $e_3$ corresponding to a portion of the thickness of the second wafer 102. The thickness $e_3$ is in the range 10 μm to 30 μm. In FIG. 2D, the flank of the trimmed layer 106 is shown in a diagrammatic manner as being perpendicular to the plane of the substrate. However, depending on the type of grinder used, the profile of the trimming flank may have different shapes that are not entirely rectilinear, such as a slightly inwardly curved shape. In particular, such inwardly curved flanks are obtained when the grinder or trimming wheel is provided with grooves over at least one of these faces. It appears that the presence of such grooves encourages evacuation of the eliminated material and circulation of liquid (generally water) dispensed over and close to the wheel during the trimming operation. This further limits heating/stresses at the wafer edge and can further improve the trimming quality. In circumstances where the trimmed flank of the layer or wafer does not have a near rectilinear profile, the widths of the trimming steps (such as widths $ld_1$ and $ld_2$) correspond at least to the widths with which the wafer or layer is attacked (the trimming width can then be slightly reduced during trimming).

Figure 2E:
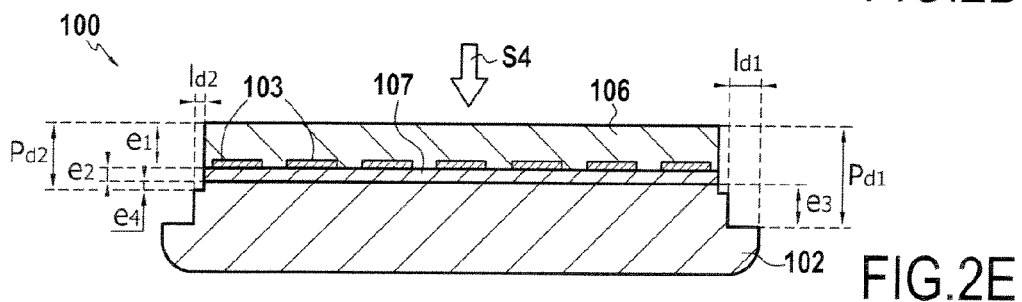
Figure 3:
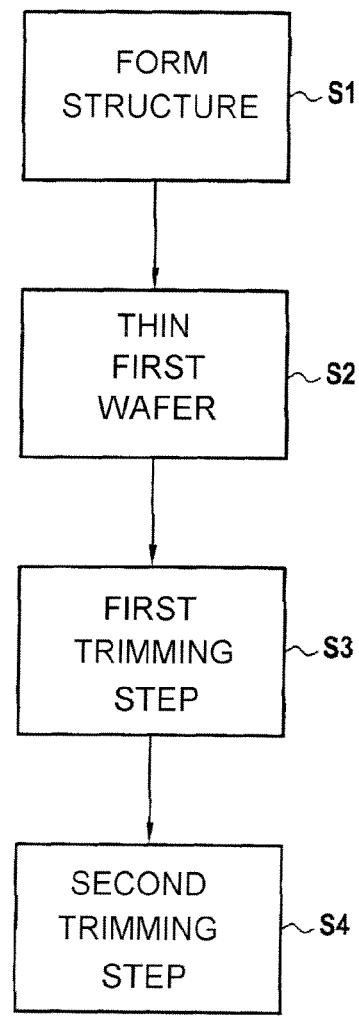
FIG. 3 is a flow diagram of the steps carried out during the method illustrated in FIGS. 2A to 2E.

Trimming is then completed by a second trimming step that is also carried out by mechanical action or machining (step S4, FIG. 2E). This second trimming step is carried out from a predetermined distance from the edge of the layer 106 corresponding to the trimming width $ld_1$ of the first step. For wafers with a diameter of 100 mm, 200 mm, and 300 mm, the trimming width $ld_2$ is generally in the range 0.1 mm to 0.2 mm.

In this second trimming step, the structure 100 is attacked over a depth $Pd_2$ comprising at least the thickness $e_1$ of the layer 106. The depth $Pd_2$ may also comprise a thickness $e_4$ corresponding to a portion of the thickness of the second wafer 102. In the example described here, the thickness $e_4$ is less than the thickness $e_3$. It is in the range 0 to 10 μm, for example 5 μm. As indicated above, the thickness $e_4$ may also be greater than or equal to the thickness $e_3$.

A particular but not exclusive field for the trimming method of the present invention is that of producing three-dimensional structures.

A method of producing a three-dimensional structure by transfer onto a support of a layer of microcomponents formed on an initial substrate in accordance with an implementation of the invention is described below in relation to FIGS. 4A to 4G and 5.

Figure 4A:
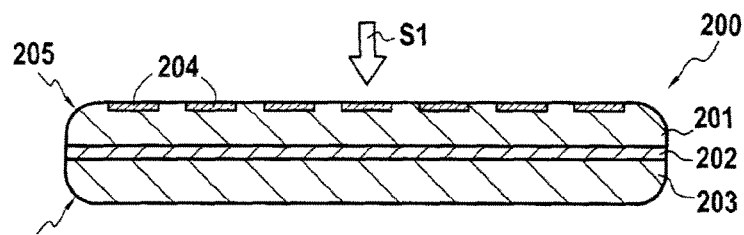
FIGS. 4A to 4F are diagrammatic views showing the production of a three-dimensional structure employing the trimming method of the present invention.
Figure 4B:
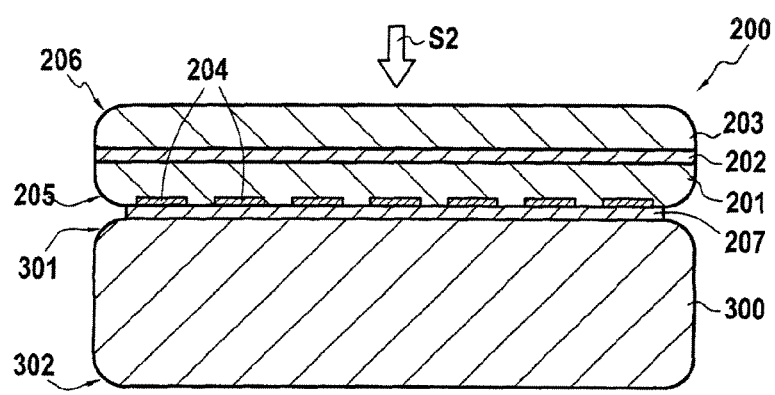

Producing the three-dimensional structure starts with the formation of a first series of microcomponents 204 on the surface of a first wafer 200 the edge of which has an upper chamfer 206 and a lower chamfer 205 (FIG. 4A, step S1). In the example described here, the first wafer 200 is a multilayer SOI type structure, i.e. it comprises a layer of silicon 201 disposed on a substrate 203, also of silicon, a buried oxide layer 202 (for example a layer of $SiO_2$) being present between the layer 201 and the substrate 203. The wafer 200 has a thickness in the range approximately 600 μm to 900 μm. For a wafer 200 mm in diameter (8 inches), the standard thickness is 725 μm.

The microcomponents 204 are formed by photolithography using a mask that can define zones for the formation of motifs corresponding to the microcomponents to be produced.

The face of the first wafer 200 comprising the microcomponents 204 is then brought into intimate contact with a face of a second wafer 300 (step S2, FIG. 4B) with a view to bonding by molecular bonding. The wafer 300 has a thickness of approximately 725 μm. In the same manner as the first wafer 200, the edge of the second wafer 300 has an upper chamfer 301 and a lower chamfer 302. A layer of oxide 207, for example formed from $SiO_2$, is also formed on the face of the first wafer 200 comprising the microcomponents 204. In the example described here, the first and second wafers 200, 300 have a diameter of 200 mm.

Figure 4C:
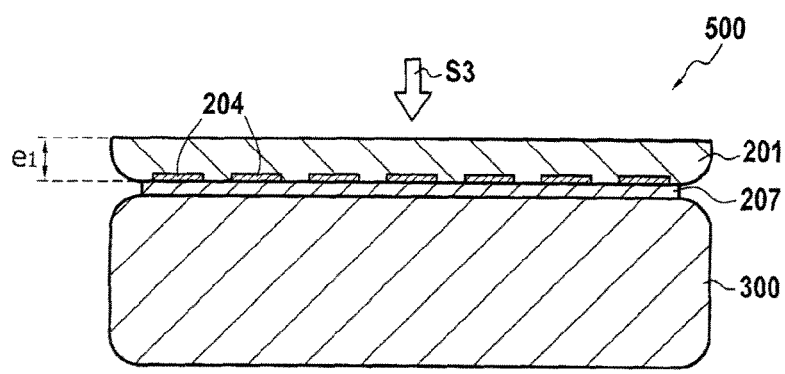

After bonding, and as can be seen in FIG. 4C, the first wafer 200 is thinned to withdraw a portion thereof present above the layer of microcomponents 204 (step S3), here the substrate 203. At this stage of the method, the buried layer 202 is preferably retained in order to protect the components from possible contamination, particles, etc. The first wafer 200 may be thinned, in particular by a step of grinding or chemical-mechanical polishing (CMP) of the substrate 203, stopping 50 µm from the bonding interface, followed by a step of chemical attack up to the buried oxide layer 202, for example by etching with tetramethylammonium hydroxide (TMAH). Thinning may also be carried out by cleavage or fracture along a plane of weakness previously formed in the wafer 200 by atomic implantation. Advantageously, the buried insulating layer 202 is used to define the thickness of the remaining wafer 200. After the thinning step, the wafer 200 has a thickness e of approximately 10 µm. In other circumstances, its thickness may lie in the range 1 µm to 15 µm.

Thus, a composite structure 500 is obtained, formed by the second wafer 300 and the layer 201 corresponding to the remaining portion of the first wafer 200.

Figure 4D:
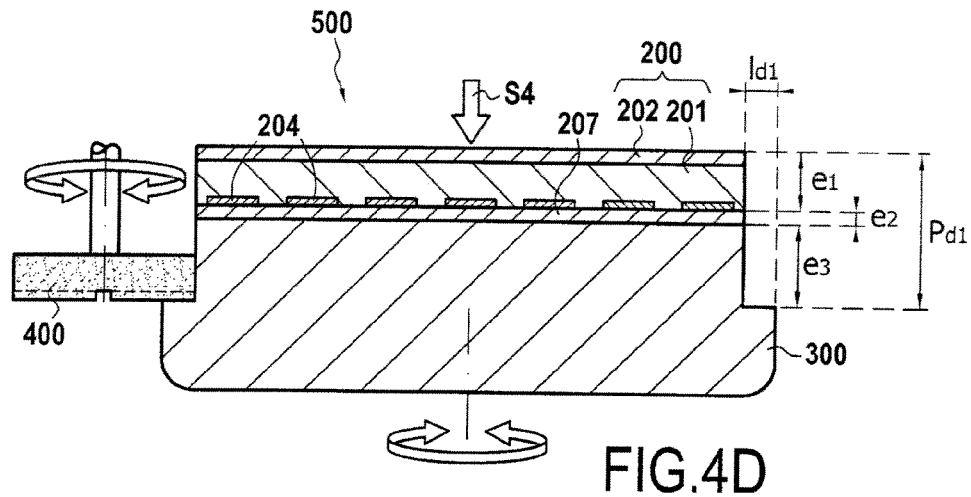
Figure 4E:
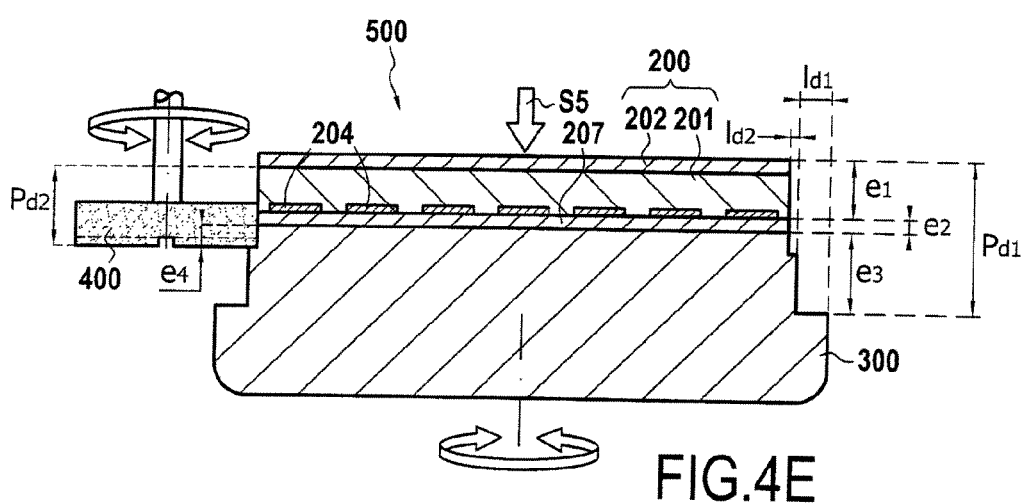
Figure 6:
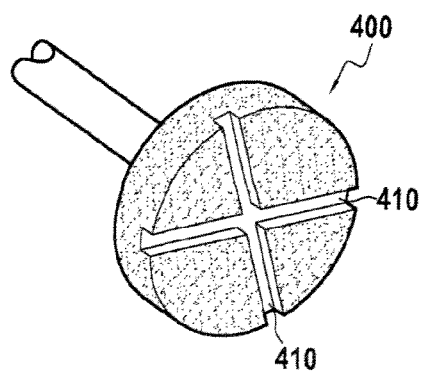
FIG. 6 is a view showing the lower surface of the grinder used in FIGS. 4D and 4E.

In accordance with the invention, the first step of mechanical trimming of the structure 500 is carried out, consisting of eliminating an annular portion of the wafer 200 (step S4, FIG. 4D). This first trimming step is carried out using a grinder 400, the structure 500 being held in a rotating plate (not shown). As can be seen in FIG. 6, the grinder 400 has a lower face that is structured due to the presence of grooves 410. As indicated above, it has been observed that a grinder with such a structured face can limit heating and stresses. Clearly, trimming may also be carried out with grinders that do not have such structured faces.

During this first trimming step, the structure 500 is attacked over a width $ld_1$ in the range 2 mm to 10 mm and over a depth $Pd_1$ comprising the thickness $e_1$ of the remaining portion of the first wafer 200, the thickness $e_2$ of the oxide layer 207 and a thickness $e_3$ corresponding to a portion of the thickness of the second wafer 300, said thickness $e_3$ being in the range 10 µm to 30 µm. Trimming is then completed by the second trimming step carried out from a predetermined distance from the edge of the wafer 200 corresponding to the trimming width $ld_1$ of the first step and over a width $ld_2$ in the range 0.1 mm to 2 mm (step S5, FIG. 4E). In this second trimming step, the structure 500 is attacked over a depth $Pd_2$ comprising the thickness $e_1$ of the remaining portion of the first wafer 200, the thickness $e_2$ of the oxide layer 207 and a thickness $e_4$ corresponding to a portion of the thickness of the second wafer 300 in the range 0 to 10 µm, for example 5 µm.

Figure 4F:
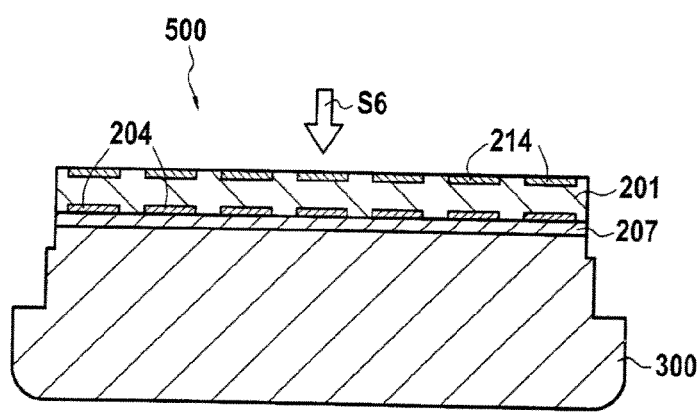
Figure 5:
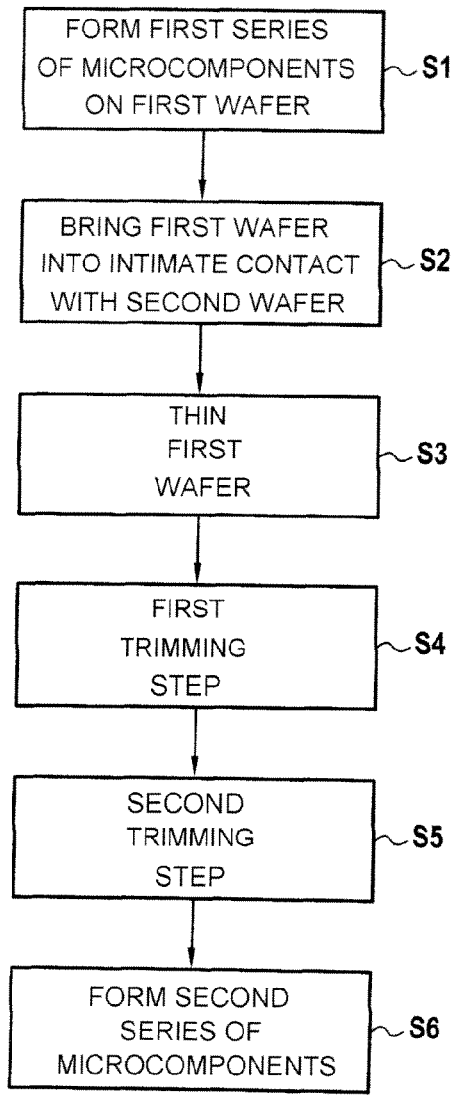
FIG. 5 is a flow diagram of the steps carried out during production of the three-dimensional structure illustrated in FIGS. 4A to 4F.

Once trimming of the structure 500 has been terminated, after having withdrawn removed the layer 202, a second layer of microcomponents 214 is formed at the exposed surface of the layer 201 (FIG. 4F, step S6). In the example described here, the microcomponents 214 are formed in alignment with the buried microcomponents 204. A photolithography mask is used for this purpose; it is similar to that used to form the microcomponents 204.

In a variation, the three-dimensional structure is formed by a stack of layers, i.e. by transfer of one or more additional layers onto the layer 201, each additional layer being in alignment with the directly adjacent layer or layers. Each additional layer is trimmed progressively using the trimming method of the invention. Further, before each transfer of an additional layer, it is possible to deposit a layer of oxide on the exposed layer, for example a layer of tetraethyloxysilane (TEOS) oxide, in order to facilitate assembly and protect the trimmed zones (for which the material of the subjacent wafer is exposed) from subsequent chemical attacks. Alternatively, a single trimming operation may be carried out after the set of layers has been transferred. The thicknesses $e_1$ and $e_2$ of the materials eliminated during the trimming step of the invention then correspond to the thicknesses included between the upper surface of the upper layer of the stack and the stop interface for the trimming step at or within the support wafer.

In accordance with a particular implementation, one of the layers of microcomponents may in particular comprise image sensors.

In accordance with another implementation, the components have already been formed in the second support wafer before assembly thereof with the first wafer constituting the transferred layer.

In accordance with yet another implementation, the trimming steps may include a first rough removal step, for example using a grinder as represented in FIG. 4D, followed by a finer removal step, for example using a wafer edge polish tool. This means that, after trimming, a wafer edge with reduced roughness can be produced that is less susceptible of having residual particles.

What is claimed is:

1. A method of reducing applied mechanical friction when trimming a bonded structure comprising a first wafer of predetermined thickness and comprising electrical components, bonded to a second wafer of predetermined thickness, with the first wafer having a chamfered edge, which method comprises:
    a first trimming step carried out by mechanical action upon the bonded structure and over a first depth comprising the thickness of the first wafer and a first portion of the thickness of the second wafer, and also being carried out over a first predetermined width from the edge of the first wafer; and
    at least one second trimming step also carried out by mechanical action upon the bonded structure and over a second depth also comprising the thickness of the first wafer and a second portion of the thickness of the second wafer, while being carried out over a second predetermined width that is less than the first width and also is further from the edge of first wafer than is the first predetermined width.

2. The method according to claim 1, wherein the second depth is less than the first depth and wherein both trimming steps produce a wafer edge having a surface which is perpendicular to a top or bottom surface of either wafer.

3. The method according to claim 1, wherein the portion of the thickness of the second wafer withdrawn during the first trimming step is in the range of 10 µm to 30 µm.

4. The method according to claim 1, wherein the portion of the thickness of the second wafer withdrawn during the second trimming step is in an amount of up to 10 µm.

5. The method according to claim 1, wherein the first trimming step is carried out over a first width in the range 2 mm to 10 mm for a wafer having a diameter of between 100 and 300 mm.

6. The method according to claim 5, wherein the second trimming step is carried out over a second width in the range of 0.1 mm to 2 mm.

7. The method according to claim 1, wherein at least one of the trimming steps is carried out with a grinder comprising grooves on its lower surface to produce a trimming surface having inwardly curved flanks.

8. The method of claim 2 wherein the width removed by the first trimming step does not remove any of the electrical components.

9. A method of producing a three-dimensional composite structure which comprises
    at least one step of producing a first layer of electrical components on one face of a first wafer, with the first wafer having a predetermined thickness,
    a step of bonding the face of the first wafer comprising the layer of electrical components onto a second wafer to form a bonded structure, with the second wafer having a predetermined thickness, and a step of trimming the first wafer and a portion of the thickness of the second wafer, by performing a method which reduces mechanical friction applied thereto, the trimming step comprising:

a first trimming sub-step carried out upon the bonded structure by mechanical action and over a first depth comprising the thickness of the first wafer and a first portion of the thickness of the second wafer, and also being carried out over a first predetermined width from an edge of the first wafer, and at least one second trimming sub-step also carried out upon the bonded structure by mechanical action and over a second depth also comprising the thickness of the first wafer and a second portion of the thickness of the second wafer, while being carried out over a second predetermined width that is less than the first width and also is further from the edge of first wafer than is the first predetermined width.

10. The method according to claim 9, which further comprises a step of thinning the first wafer is conducted after bonding.

11. The method according to claim 9, which further comprises a step of producing a second layer of electrical components on the face of the first wafer opposite to the face comprising the first layer of electrical components.

12. The method according to claim 9, which further comprises a step of forming a layer of oxide on the face of the first wafer comprising the first layer of electrical components before bonding.

13. The method according to claim 9, wherein the first wafer is a SOI type structure.

14. The method according to claim 9, wherein at least the first layer of electrical components comprises image sensors.

15. The method of claim 9 wherein the width removed by the first trimming does not remove any of the electrical components.

16. In a method of trimming a layer of a bonded structure by mechanical machining, wherein the structure comprises a first wafer of predetermined thickness and comprising electrical components, bonded to a second wafer of predetermined thickness, the improvement which comprises:

conducting a first mechanical machining of the first wafer of the bonded structure over a first predetermined depth comprising the thickness of the first wafer and a first portion of the thickness of the second wafer, and also being carried out over a first predetermined width from the edge of the first wafer; and conducting a second mechanical machining of the first wafer of the bonded structure over a second depth also comprising the thickness of the first wafer and a second portion of the thickness of the second wafer while being carried out over a second width that is less than the first width and also is further from the edge of first wafer than is the first predetermined width.

17. The method of claim 16 wherein the width removed by the first mechanical machining step does not remove any of the electrical components.

\* \* \* \* \*

UNITED STATES PATENT AND TRADEMARK OFFICE
CERTIFICATE OF CORRECTION

PATENT NO. : 8,679,944 B2  
APPLICATION NO. : 12/934026  
DATED : March 25, 2014  
INVENTOR(S) : Marcel Broekaart et al.

It is certified that error appears in the above-identified patent and that said Letters Patent is hereby corrected as shown below:

In the specification:

COLUMN 7,    LINE 44,    change "having withdrawn removed" to --having removed--

Signed and Sealed this
Twenty-second Day of September, 2015

Michelle K. Lee
*Director of the United States Patent and Trademark Office*